US011763358B2

(12) United States Patent
Wang et al.

(10) Patent No.: US 11,763,358 B2
(45) Date of Patent: Sep. 19, 2023

(54) PER-TENANT COST CALCULATION IN MULTI-TENANT DATA STORAGE SYSTEM

(71) Applicant: EMC IP Holding Company LLC, Hopkinton, MA (US)

(72) Inventors: Tianqing Wang, Shanghai (CN); Qiyan Chen, Shanghai (CN); Robert B. Masson, Hingham, MA (US); Yun Zhang, Shanghai (CN); Lin Peng, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 1012 days.

(21) Appl. No.: 16/394,134

(22) Filed: Apr. 25, 2019

(65) Prior Publication Data

US 2019/0251606 A1 Aug. 15, 2019

Related U.S. Application Data

(63) Continuation of application No. 13/533,527, filed on Jun. 26, 2012, now abandoned.

(51) Int. Cl.
*G01R 21/00* (2006.01)
*G06Q 30/0283* (2023.01)

(52) U.S. Cl.
CPC ......... *G06Q 30/0283* (2013.01); *G01R 21/00* (2013.01); *Y04S 20/30* (2013.01)

(58) Field of Classification Search
CPC ...... G06Q 30/0283; G01R 21/00; Y04S 20/30
See application file for complete search history.

(56) References Cited

U.S. PATENT DOCUMENTS

2006/0132473 A1\* 6/2006 Fuller ................... G06F 3/1438
345/204
2008/0077366 A1\* 3/2008 Neuse ................ G06Q 30/0283
703/2

(Continued)

FOREIGN PATENT DOCUMENTS

CN 1183841 A \* 6/1998 ............. G06F 21/00

OTHER PUBLICATIONS

L. Xu, G. Tan, X. Zhang and J. Zhou, "Energy aware cloud application management in private cloud data center," 2011 International Conference on Cloud and Service Computing, 2011, pp. 274-279, doi: 10.1109/CSC.2011.6138533. (Year: 2011).\*

(Continued)

*Primary Examiner* — Robert H Kim
*Assistant Examiner* — Christopher J Gassen
(74) *Attorney, Agent, or Firm* — Ryan, Mason & Lewis, LLP

(57) ABSTRACT

Techniques for calculating a per-tenant cost in a multi-tenant data storage system. In one example, a method comprises the following steps. One or more cost contribution factors associated with a storage provider entity operating a data storage system for a plurality of tenants of the data storage system are identified. One or more cost items chargeable to each of the plurality of tenants are identified, the one or more cost items being associated with usage of the data storage system by each of the plurality of tenants. The one or more cost contribution factors associated with the storage provider entity are correlated with the one and more chargeable cost items for each of the plurality of tenants. A respective cost value payable by each tenant is determined based on the correlation step. In one further example, the methodology calculates a fixed energy cost associated with storing tenant (Continued)

data and a dynamic energy cost associated with the tenant accessing the stored data.

20 Claims, 5 Drawing Sheets

(56) References Cited

U.S. PATENT DOCUMENTS

| | | | |
|---|---|---|---|
| 2009/0288084 A1 | 11/2009 | Astete et al. | |
| 2011/0119104 A1 | 5/2011 | Levine et al. | |
| 2011/0320865 A1* | 12/2011 | Jain | G06F 3/0685 |
| | | | 714/E11.088 |
| 2012/0084261 A1* | 4/2012 | Parab | G06F 11/1458 |
| | | | 707/674 |
| 2012/0131161 A1* | 5/2012 | Ferris | G06Q 30/02 |
| | | | 709/223 |
| 2012/0158328 A1* | 6/2012 | Hurri | G06Q 50/10 |
| | | | 702/62 |
| 2012/0254640 A1* | 10/2012 | Agarwala | G06F 3/0635 |
| | | | 713/320 |

OTHER PUBLICATIONS

Z. Zhang and S. Fu, "Characterizing Power and Energy Usage in Cloud Computing Systems," 2011 IEEE Third International Conference on Cloud Computing Technology and Science, 2011, pp. 146-153, doi: 10.1109/CloudCom.2011.29. (Year: 2011).*

San Murugesan; G. R. Gangadharan, "Green Cloud Computing and Environmental Sustainability," in Harnessing Green IT: Principles and Practices, IEEE, 2012, pp. 315-339, doi: 10.1002/9781118305393.ch16. (Year: 2012).*

F. Chen, J. Schneider, Y. Yang, J. Grundy and Q. He, "An energy consumption model and analysis tool for Cloud computing environments," 2012 First International Workshop on Green and Sustainable Software (GREENS), 2012, pp. 45-50, doi: 10.1109/GREENS.2012.6224255. (Year: 2012).*

Albert Y. Zomaya; Young Choon Lee, "Autonomic Green Computing in Large-Scale Data Centers," in Energy-Efficient Distributed Computing Systems, IEEE, 2012, pp. 271-299, doi: 10.1002/9781118342015.ch10. (Year: 2012).*

P. Mell et al., "The NIST Definition of Cloud Computing," U.S. Department of Commerce, Computer Security Division, National Institute of Standards and Technology, Special Publication 800-145, Sep. 2011, 7 pages.

* cited by examiner

PER-TENANT COST CALCULATION IN MULTI-TENANT DATA STORAGE SYSTEM

FIELD

The field relates to data storage systems, and more particularly to techniques for calculating a per-tenant cost in a multi-tenant data storage system.

BACKGROUND

Data storage systems are computer systems that provide data storage services for tenants (users) of the data storage system. The data storage system is maintained and managed by a storage provider entity, and the tenants are typically customers of the storage provider entity.

It is known that data storage systems can be implemented in a distributed virtual infrastructure, also known as a cloud infrastructure. In such an implementation, a plurality of physical storage devices (e.g., tens to hundreds of physical storage devices) compose one large logical storage system. A basic functional element of storage for a virtual infrastructure-based data storage system is known as a "logical unit" (LU). A "logical unit number" (LUN) is a unique identifier used to designate a logical unit. Each LU may be part of a physical storage device, an entire physical storage device, or multiple physical storage devices in the data storage system. One or more LUs may be part of a storage array that is accessible over a storage area network (SAN). Thus, by way of example only, a LUN could identify an entire redundant array of independent disks (RAID) set, a single disk or partition, or multiple hard disks or partitions. In any case, an LU is typically treated as if it is a single device and is identified by the LUN. In such an environment, LUs are added and removed as storage demand changes.

Operating a data storage system costs a storage provider entity a significant amount of money, and thus a need arises to charge tenants in order to compensate the costs. In the case that only one tenant uses the entire data storage system, it is quite easy to determine that the sole tenant should be charged for all of such chargeable costs. But realistically, most data storage systems are multi-tenant systems with large numbers of tenants, especially those that are implemented in a distributed virtual (cloud) infrastructure. Thus, how to charge each tenant fairly and efficiently raises a significant challenge for the storage provider entity.

SUMMARY

Embodiments of the invention provide techniques for calculating a per-tenant cost in a multi-tenant data storage system.

In one embodiment, a method comprises the following steps. One or more cost contribution factors associated with a storage provider entity operating a data storage system for a plurality of tenants of the data storage system are identified. One or more cost items chargeable to each of the plurality of tenants are identified, the one or more cost items being associated with usage of the data storage system by each of the plurality of tenants. The one or more cost contribution factors associated with the storage provider entity are correlated with the one and more chargeable cost items for each of the plurality of tenants. A respective cost value payable by each tenant is determined based on the correlation step.

By way of one example, the correlating step may further comprise determining a fixed cost for each tenant, the fixed cost comprising an idle energy cost associated with the static storage of tenant data on the data storage system separate from the tenant accessing the stored data. The correlating step may also comprise determining a dynamic cost for each tenant, the dynamic cost comprising an energy cost associated with the tenant accessing data stored on the data storage system. Still further, the correlating step may comprise determining a service level agreement cost for each tenant, the service level agreement cost comprising one or more additional fixed costs and dynamic costs associated with one or more performance guarantees agreed upon between the storage provider entity and each tenant in a service level agreement. In such an example, the respective cost value payable by a given one of the tenants comprises a sum of the fixed cost, the dynamic cost, and the service level agreement cost attributable to the given tenant.

In another embodiment, a computer program product is provided which comprises a processor-readable storage medium having encoded therein executable code of one or more software programs. The one or more software programs when executed by a processor of a processing device implement steps of the above-described method.

In yet another embodiment, an apparatus comprises a memory and a processor operatively coupled to the memory and configured to perform steps of the above-described method.

Advantageously, embodiments of the per-tenant cost calculation techniques described herein provide a fair and efficient mechanism for a storage provider entity to charge each tenant in a multi-tenant data storage system, especially such a data storage system implemented in a cloud infrastructure.

These and other features and advantages of the present invention will become more readily apparent from the accompanying drawings and the following detailed description.

DETAILED DESCRIPTION

Embodiments of the present invention will be described herein with reference to exemplary computing systems and data storage systems and associated servers, computers, storage units and devices and other processing devices. It is to be appreciated, however, that embodiments of the invention are not restricted to use with the particular illustrative system and device configurations shown. Moreover, the phrases "computing system" and "data storage system" as used herein are intended to be broadly construed, so as to encompass, for example, private or public cloud computing or storage systems, as well as other types of systems comprising distributed virtual infrastructure. However, a given embodiment may more generally comprise any arrangement of one or more processing devices.

As used herein, the term "cloud" refers to a collective computing infrastructure that implements a cloud computing paradigm. For example, as per the National Institute of Standards and Technology (NIST Special Publication No. 800-145), cloud computing is a model for enabling ubiquitous, convenient, on-demand network access to a shared pool of configurable computing resources (e.g., networks, servers, storage, applications, and services) that can be rapidly provisioned and released with minimal management effort or service provider interaction.

Figure 1A:
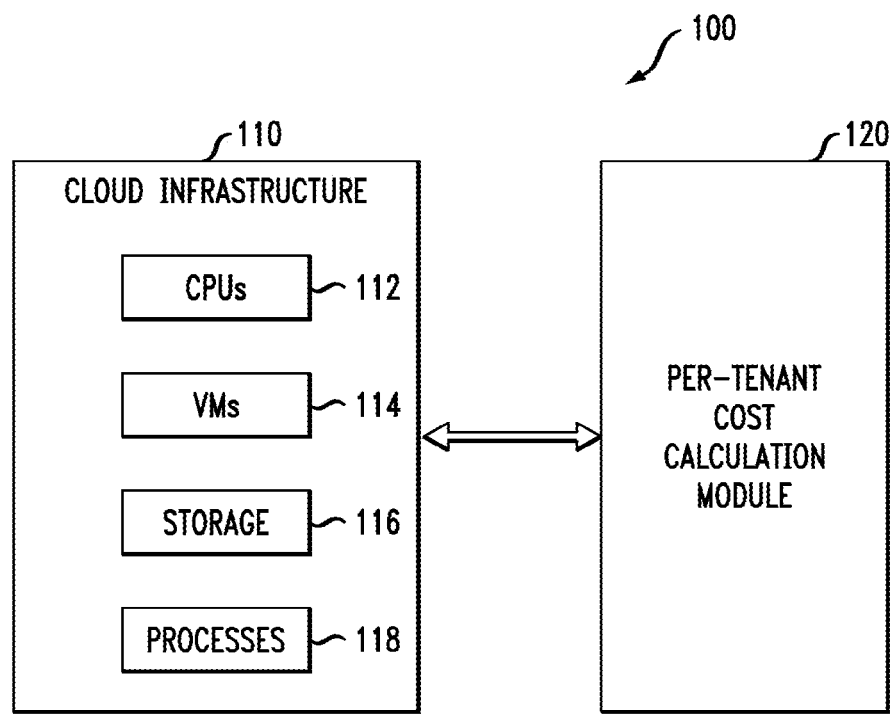
FIG. 1A illustrates cloud infrastructure and a per-tenant cost calculation module in accordance with one embodiment of the invention.

FIG. 1A shows a system 100 configured in accordance with an illustrative embodiment of the present invention. The system 100 comprises cloud infrastructure 110 and a per-tenant cost calculation module 120. As will be explained in detail below, the per-tenant cost calculation module 120 identifies costs attributable to each tenant in a multi-tenant data storage system implemented within cloud infrastructure 110. Cloud infrastructure 110 is illustratively depicted in the figure as comprising an execution environment with execution components comprising one or more central processing units (CPUs) 112, one or more virtual machines (VMs) 114, and storage devices 116 (upon which logical units (LUs) are implemented) that execute one or more processes 118 that operate on one or more process input data sets that generate one or more process output data sets.

Although cloud infrastructure 110 and calculation module 120 are shown as separate elements in FIG. 1A, these elements or portions thereof may be implemented at least in part on a common processing platform. In other embodiments, one or more of the cloud infrastructure 110 and calculation module 120 may each be implemented on a separate processing platform, such as the processing platform to be described below in conjunction with FIG. 2. For example, the cloud infrastructure 110 may be implemented on a first processing device of a first processing platform and the per-tenant cost calculation module 120 may be implemented on a second processing device of a second processing platform. It is also to be understood that a given embodiment of the system 100 may include multiple instances of the cloud infrastructure 110 and calculation module 120, although only single instances of such elements are shown in the system diagram for clarity and simplicity of illustration.

Figure 1B:
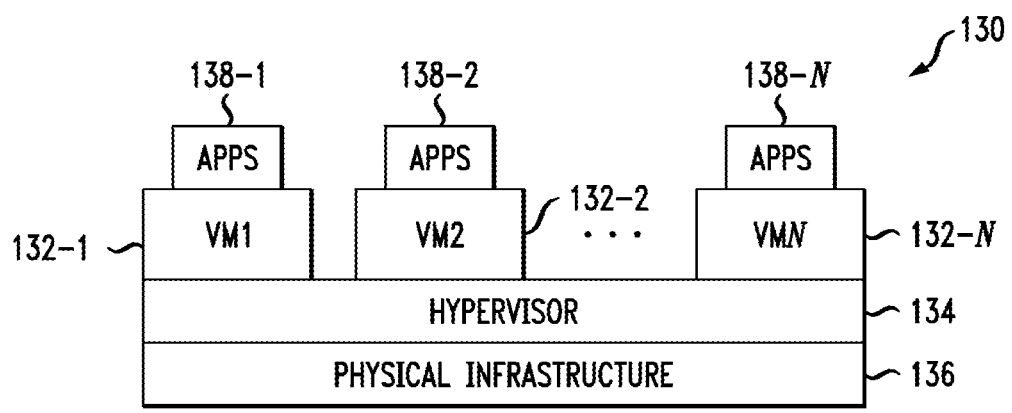
FIG. 1B illustrates a more detailed view of the cloud infrastructure of FIG. 1A.

As shown in FIG. 1B, the cloud infrastructure 130 (corresponding to 110 in FIG. 1A) comprises virtual machines (VMs) 132-1, 132-2, . . . 132-N implemented using a hypervisor 134. The hypervisor 134 is an example of what is more generally referred to herein as "virtualization infrastructure." The hypervisor 134 runs on physical infrastructure 136 (e.g., such as may include CPUs 112 and/or storage devices 116 in FIG. 1A). The cloud infrastructure 130 further comprises sets of applications 138-1, 138-2, . . . 138-N running on respective ones of the virtual machines 132-1, 132-2, . . . 132-N (utilizing associated LUs) under the control of the hypervisor 134.

Although only a single hypervisor 134 is shown in the example of FIG. 1B, a given embodiment of cloud infrastructure configured in accordance with an embodiment of the invention may include multiple hypervisors, each running on its own physical infrastructure. Portions of that physical infrastructure might be virtualized.

As is known, virtual machines are logical processing elements that may be instantiated on one or more physical processing elements (e.g., servers, computers, processing devices). That is, a "virtual machine" generally refers to a software implementation of a machine (i.e., a computer) that executes programs in a manner similar to that of a physical machine. Thus, different virtual machines can run different operating systems and multiple applications on the same physical computer. Virtualization is implemented by the hypervisor 134 which, as shown in FIG. 1B, is directly inserted on top of the computer hardware in order to allocate hardware resources of the physical computer dynamically and transparently. The hypervisor 134 affords the ability for multiple operating systems to run concurrently on a single physical computer and share hardware resources with each other.

An example of a commercially available hypervisor platform that may be used to implement portions of the cloud infrastructure 130 (110) in one or more embodiments of the invention is the VMware® vSphere™ which may have an associated virtual infrastructure management system such as the VMware® vCenter™. The underlying physical infrastructure 136 may comprise one or more distributed processing platforms that include storage products such as VNX and Symmetrix VMAX, both commercially available from EMC Corporation of Hopkinton, Mass. A variety of other storage products may be utilized to implement at least a portion of the cloud infrastructure 130 (110).

Figure 2:
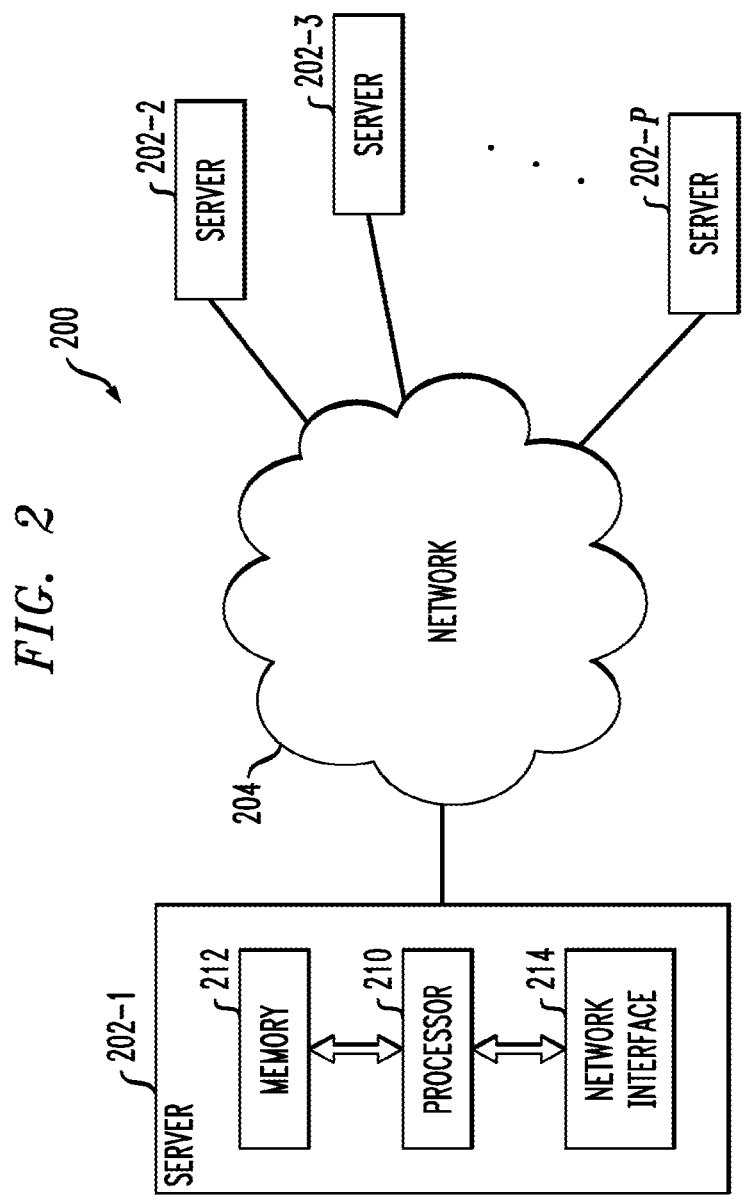
FIG. 2 illustrates a processing platform on which the cloud infrastructure and the per-tenant cost calculation module of FIG. 1A are implemented in accordance with one or more embodiments of the invention.

An example of a processing platform on which the cloud infrastructure 110 and/or the per-tenant cost calculation module 120 of FIG. 1A may be implemented is processing platform 200 shown in FIG. 2. The processing platform 200 in this embodiment comprises at least a portion of the system 100 and includes a plurality of servers, denoted 202-1, 202-2, 202-3, . . . 202-P, which communicate with one another over a network 204. One or more of the elements of system 100 may therefore each run on a server, computer or other processing platform element, which may be viewed as an example of what is more generally referred to herein as a "processing device." As illustrated in FIG. 2, such a device generally comprises at least one processor and an associated memory, and implements one or more functional modules for controlling certain features of system 100. Again, multiple elements or modules may be implemented by a single processing device in a given embodiment.

The server 202-1 in the processing platform 200 comprises a processor 210 coupled to a memory 212. The processor 210 may comprise a microprocessor, a microcontroller, an application-specific integrated circuit (ASIC), a field programmable gate array (FPGA) or other type of processing circuitry, as well as portions or combinations of such circuitry elements. The memory 212 may be viewed as an example of what is more generally referred to herein as a "computer program product." A computer program product comprises a processor-readable storage medium (which is a non-transitory medium) having encoded therein executable code of one or more software programs. Such a memory may comprise electronic memory such as random access memory (RAM), read-only memory (ROM) or other types of memory, in any combination. The computer program code when executed by a processing device such as the server 202-1 causes the device to perform functions associated with one or more of the elements of system 100. One skilled in the art would be readily able to implement such software given the teachings provided herein. Other examples of computer program products embodying embodiments of the invention may include, for example, optical or magnetic disks.

Also included in the server 202-1 is network interface circuitry 214, which is used to interface the server with the network 204 and other system components. Such circuitry may comprise conventional transceivers of a type well known in the art.

The other servers 202 of the processing platform 200 are assumed to be configured in a manner similar to that shown for server 202-1 in the figure.

The processing platform 200 shown in FIG. 2 may comprise additional known components such as batch processing systems, parallel processing systems, physical machines, virtual machines, virtual switches, storage volumes, logical units, etc. Again, the particular processing platform shown in the figure is presented by way of example only, and system 100 may include additional or alternative processing platforms, as well as numerous distinct processing platforms in any combination.

Also, numerous other arrangements of servers, computers, storage devices or other components are possible in system 100. Such components can communicate with other elements of the system 100 over any type of network, such as a wide area network (WAN), a local area network (LAN), a satellite network, a telephone or cable network, or various portions or combinations of these and other types of networks.

Illustrative details of the per-tenant cost calculation module 120, as well as operations of elements of system 120 will now be described with reference to FIGS. 3 through 5.

Figure 3:
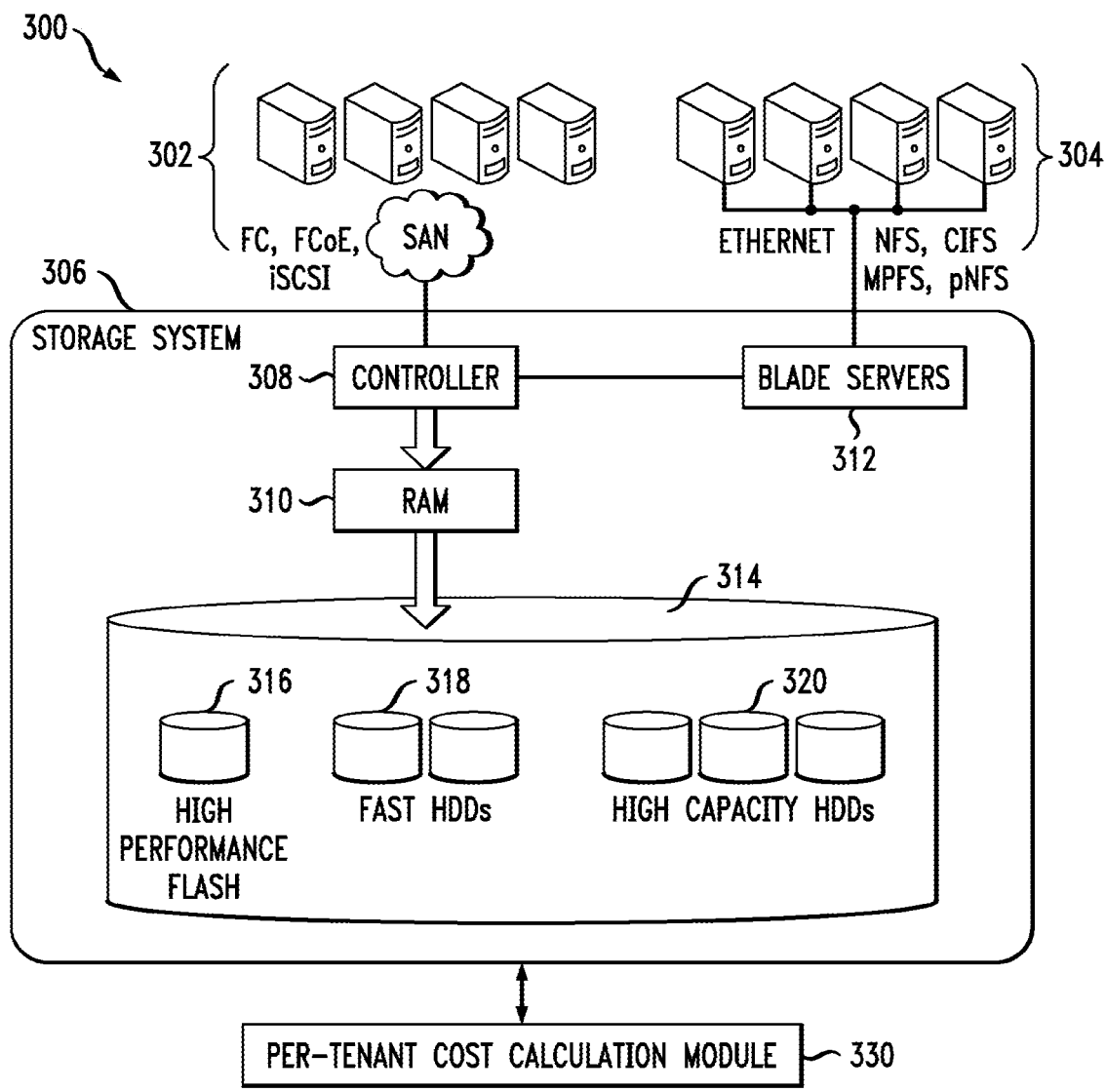
FIG. 3 illustrates a data storage system environment in accordance with one embodiment of the invention.

FIG. 3 illustrates a data storage system environment 300 in accordance with one embodiment of the invention. As shown, data storage system environment 300 includes a storage area network (SAN) 302, a file system 304, a data storage system 306 and a per-tenant cost calculation module 330.

It is to be understood that data storage system 306 is part of SAN 302, and communicates therewith via one or more communication protocols including, but not limited to, Fibre Channel (FC), Fibre Channel over Ethernet (FCoE) and Internet Small Computer System Interface (iSCSI). SAN 302 may include one or more other data storage systems similar to data storage system 306. File system 304 allows tenants of data storage system 306 to access data stored thereon. File access protocols may include, but are not limited to, Network File System (NFS), parallel NFS (pNFS), Multi-Path File System (MPFS) and Common Internet File System (CIFS). Those of ordinary skill in the art will understand the functions and operations of SAN 302 and file system 304, and thus these elements will not be further described in detail.

As shown, data storage system 306 includes a controller (one or more storage processors) 308, random access memory (RAM) or cache 310, one or more blade servers (file system servers) 312, and one or more hybrid disk arrays 314 including, but not limited to, high performance flash drives (e.g., solid state drives or SSDs), fast hard disk drives (HDDs) and high capacity HDDs.

As mentioned above, a data storage system such as system 306 may typically include tens to hundreds of physical storage devices which function as one large logical storage system to serve a large number of tenants. Operating such a large storage system costs the storage provider entity a significant amount of money, and thus there is a need to individually charge tenants to compensate the cost. However, the task of calculating an individual tenant's cost can be challenging for the storage provider entity.

Accordingly, embodiments of the invention provide a cost calculation methodology and apparatus for determining how to charge each tenant fairly based on tenant resource usage. In FIG. 3, such methodologies and apparatus are illustratively depicted as being implemented by the per-tenant cost calculation module 330 (which corresponds to module 120 in FIG. 1), which is operatively coupled to data storage system 306. Advantageously, these per-tenant cost calculation techniques can be implemented in new data storage systems, as well as being integrated into existing data storage systems, to perform cost audits on the tenants.

Figure 4:
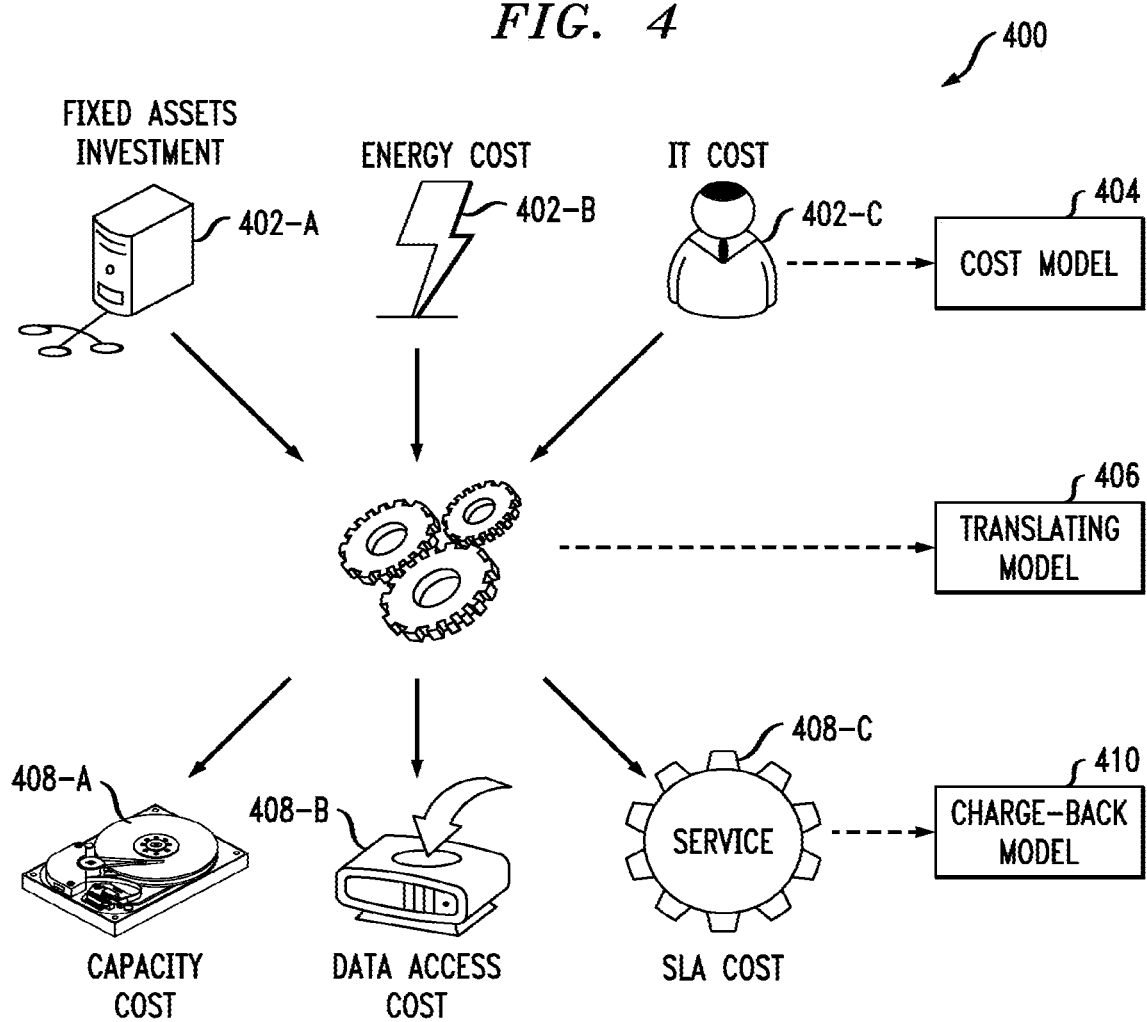
FIG. 4 illustrates a per-tenant cost calculation methodology in accordance with one embodiment of the invention.

FIG. 4 illustrates a per tenant cost calculation methodology in accordance with one embodiment of the invention. It is to be understood that this methodology may be performed in per-tenant cost calculation module 120/330 (FIG. 1/FIG. 3) in accordance with data storage system 306 (FIG. 3). In this embodiment, the cost calculation methodology 400 comprises three main parts: a storage provider cost model 404, a translating model 406 and a tenant charge-back model 410. By the term "model," it is intended to generally refer to a computer-processable representation of the data that is the subject of the model's domain. Further, one model may operate on data from one or more other models.

More particularly, the storage provider cost model 404 identifies the one or more main cost contribution factors associated with the storage provider entity operating the multi-tenant data storage system. The tenant charge-back model 410 identifies the one or more main chargeable cost items for each tenant associated with usage of the data storage system. Thus, there may be a separate tenant charge-back model for each tenant or for a group of similarly-situated tenants.

The translating model 406 performs the cost calculation by effectively translating the storage provider's cost model 404 into the tenant's charge-back model 410. More particularly, the translating model 406 correlates the one or more cost contribution factors associated with the storage provider entity (from the cost model 404) with the one and more chargeable cost items for each of the plurality of tenants (from the charge-back model 410).

We now describe each model in greater detail.

The storage provider's cost model 404 represents the cost composition of the storage provider's total cost in the lifecycle of a data storage system. In this embodiment, the cost model 404 contains three major parts: a fixed asset investment cost factor 402-A; an energy cost factor 402-B; and an information technology specialist (IT) cost factor 402-C.

The fixed asset investment cost factor 402-A accounts for the fact that the storage provider first needs to rent/build buildings to host hardware, then needs to purchase hardware and software to build up the storage system. These kinds of costs are categorized into the fixed asset investment cost factor.

The energy cost factor 402-B accounts for the energy cost associated with operating the data storage system. It is realized that energy cost is the major daily operating cost for a data storage system. Besides direct energy costs for the data storage system, indirect energy costs for cooling, network and other infrastructure contribute a significant percentage to the overall energy cost.

The IT cost factor 402-C accounts for the fact that the storage provider entity needs IT specialists to maintain an acceptable hardware and software working status for the data storage system, which can cost a significant amount of money.

Turning now to the tenant's charge-back model 410, it is realized that when a tenant consumes storage services, the tenant will occupy some storage space, produce some read/write data traffic and reserve additional resources for a higher quality of service (QoS). Thus, in accordance with one embodiment, three main chargeable cost items for the charge-back model are identified: a fixed storage capacity cost factor 408-A; a data access cost factor 408-B; and a service level agreement (SLA) cost factor 408-C.

More particularly, the fixed cost on capacity is represented by cost factor 408-A. It is realized that storage capacity is the most important and widely accepted usage measure item. Fixed cost refers to the cost incurred when a tenant occupies some storage space in the data storage system but does not take into account any cost of data access. Thus, in this embodiment, data storage cost is accounted for separate (distinct) from data access cost. Thus, the data access cost factor 408-B accounts for the fact that when servicing a tenant's data read/write requests, the data storage system will consume energy because of performing internal workloads.

The SLA cost factor 408-C realizes that tenants will need some form of an SLA (agreed upon between the tenant and the storage provider entity) to guarantee its service. For example, assume that an availability SLA specifies that the tenant wants his/her storage 99.999% online. Thus, the storage provider needs to expend more effort to ensure this guarantee and, in turn, needs to charge the tenant more money for this SLA provision.

Turning now to the translating model 406, this model is the core part of the calculation methodology. As explained above, the translating model 406 translates the cost model 404 into the charge-back model 410. This will be further explained below.

It is realized that energy cost is the major cost in daily operation of a data storage system, and is the largest variable part of the overall cost compared to fixed asset investment and IT costs. The energy cost of a data storage system involves complex physical storage device and other infrastructure energy costs, and is the most challenging part in developing the translating model.

Accordingly, in one embodiment, the energy consumption and thus the corresponding cost for a data storage system is divided into fixed (static) and dynamic parts. The fixed part is the energy consumed when the data storage system is in an idle state (i.e., the storage system is storing tenant data and is ready for data requests, but there are no incoming data requests). The dynamic part is the energy consumed by the internal workloads performed by the storage system to serve the data requests. Typical high-level workloads may include, but are not limited to, read/write, backup and data de-duplication. These high-level workloads can be mapped into low-level workloads which may include, but are not limited to, storage processor computing, disk I/O (input/output) and internal data transfer between different modules. This workload information can be obtained from the data storage system.

Consistent with this energy cost division, the translating model 406 is configured to perform the following calculations:

(i) Fixed cost on capacity (408-A) formula. This calculation contains fixed asset investment cost 402-A (e.g., the total cost divided by total capacity and recovery term in hours), IT maintenance cost 402-C (e.g., total cost divided by total capacity and time span in hours), and idle energy cost (e.g., total idle energy cost divided by total capacity and time span in hours). The unit of the fixed cost is $ (dollar) per hour per G (gigabyte of data storage).

(ii) Data access cost (408-B) formula. This is the dynamic energy cost on the storage system and other infrastructure based on workloads performed to serve the data access requests. The unit of data access cost is $ per G per read or $ per G per write, since a read operation significantly differs from a write operation with regard to energy cost.

(iii) SLA cost (408-C) formula. SLA cost is composed of additional fixed cost on capacity and data access cost. For example, if a tenant wants a data protection SLA, the storage provider will provide redundant storage space with additional data access. This kind of additional cost is accounted for in the SLA cost.

Thus, in accordance with the above formulas, the translating model 406 determines the respective cost value (per-tenant cost) payable by a given one of the tenants of the data storage system 306 by summing the fixed cost of 408-A, the dynamic cost of 408-B, and the service level agreement cost of 408-C attributable to the given tenant.

Figure 5:
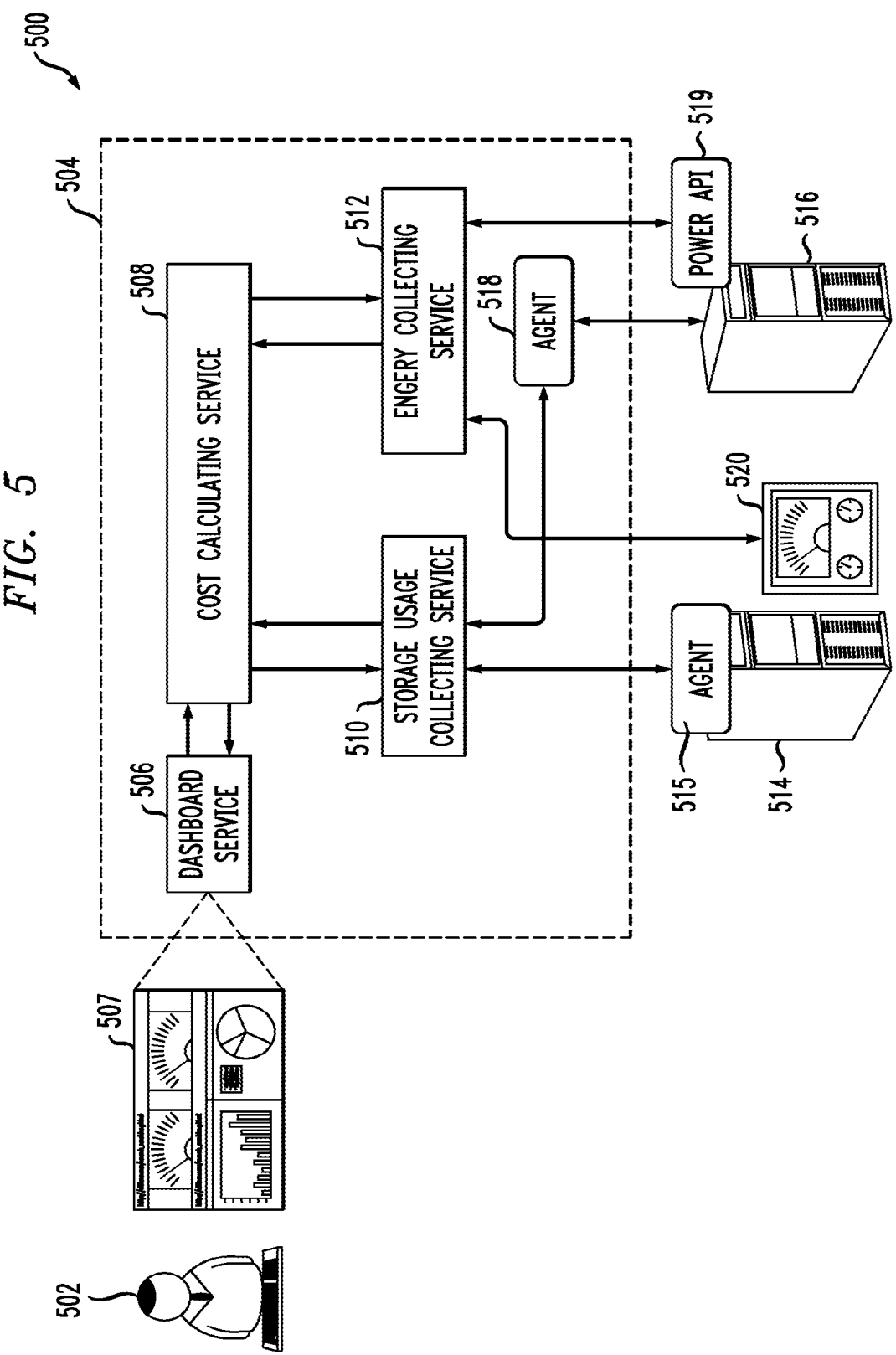
FIG. 5 illustrates a per-tenant cost calculation system environment in accordance with one embodiment of the invention.

Turning now to FIG. 5, a per-tenant cost calculation system environment is depicted in accordance with one embodiment of the invention. The per-tenant cost calculation system is denoted as 504 in FIG. 5. It is to be understood that system 504 may be one example of a per-tenant cost calculation module 120/330 (FIG. 1/FIG. 3). Further, in one embodiment, the system 504 as well as other components/devices shown in the environment 500 may be implemented on the processing platform 200 of FIG. 2.

In general, system 504 captures the storage provider's cost model (404 in FIG. 4), then based on a tenant's SLA options (408-C), storage usage (408-A) and data access usage (408-B), the system automatically calculates each tenant's cost as explained above in the context of FIG. 4.

More particularly, as shown, the system 504 includes a dashboard service component 506, a graphical user interface 507 (for viewing on a display by a user 502 of the system), a cost calculating service component 508, a tenant storage usage collecting service component 510, an energy collecting service component 512, and an agent component 518. Servers 514 and 516 represent the data storage system for which cost is being determined. Only two servers are shown for simplicity; however, it is understood that a typical data storage system can include tens to hundreds of servers. Server 514 has an agent component 515, and server 516 has a power application programming interface (API) 519, which will be explained below in greater detail. A smart (power) meter 520 is also part of the data storage system.

More particularly, dashboard service component 506 provides a user interface (interface 507) service both for storage provider and tenant, as both can be considered users of the system. This enables the user to view results of the cost calculation methodologies described herein. Results may include, but are not limited to, graphical representations of the calculated costs, as well as cost factors (from the corresponding models) that went into the calculations.

As an initial system phase, the storage provider entity inputs its fixed assets investment costs, recovery time and total capacity of the data storage system. The storage provider entity then specifies the tenant's storage configuration. Also, the storage provider entity inputs IT costs. After operating the data storage system in conjunction with the cost calculation system for a period of time (e.g., minute, day, week, month, year, or some other time unit), the storage provider entity is thus able to obtain its energy cost, IT cost, etc., and thus the charge-back bill on each tenant, as explained in detail herein. This may be viewed by the storage provider on a display coupled to the system.

From the tenant perspective, when a new tenant seeks data storage services, it is understood that the tenant requests some amount of storage space and an SLA. Then, after using the data storage system for a period of time (e.g., minute, day, week, month, year, or some other time unit), the tenant will receive a bill calculated by system 504. This may be viewed by the tenant on a display coupled to the system.

More particularly, as illustrated in FIG. 5, energy collecting service component 512 collects energy cost information on the data storage system, and other infrastructure if appropriate, through smart meter 520 or a power API 519 (it is assumed that server 516 can report its own power consumption via a power API).

Tenant storage usage collecting service component 510 collects the storage capacity used by a given server (e.g., server 514 or 516) in the data storage system, as well as workloads performed and SLA configuration. In the case of server 514, an agent component 515 resides on the server to provide this information. In the case of server 516, an agent component 518, assigned to this server, resides on the system 504 to provide this information. Note that FIG. 5 shows just two examples of possible agent component implementations. Alternate embodiments may be realized in a straightforward manner.

As further illustrated, it is to be appreciated that some storage devices provide an API or a command line interface (CLI) to pull the configuration and other information from a storage device such as a server. For this kind of a storage device, an API/CLI invoke module is used. But for some other storage devices which do not provide any CLI or API (e.g., server 514), the embedded agent (e.g., 515) may be employed to provide the information.

Lastly, the cost calculating service component 508 uses the cost calculating methodologies described herein, e.g., employed by a translating model (406 in FIG. 4), to translate the storage provider's cost model (404) into the tenant's charge-back model (410). Note that the information that composes the models is captured by the collecting service components 510 and 512. Calculation results are reported to the dashboard service component 506.

It should again be emphasized that the above-described embodiments of the invention are presented for purposes of illustration only. Many variations may be made in the particular arrangements shown. For example, although described in the context of particular system and device configurations, the techniques are applicable to a wide variety of other types of information processing systems, computing systems, data storage systems, processing devices and distributed virtual infrastructure arrangements. In addition, any simplifying assumptions made above in the course of describing the illustrative embodiments should also be viewed as exemplary rather than as requirements or limitations of the invention. Numerous other alternative embodiments within the scope of the appended claims will be readily apparent to those skilled in the art.

What is claimed is:

1. A method, comprising:
    collecting, via at least one processing device, storage capacity data from at least one agent component associated with at least one server in a data storage system, wherein the data storage system is operated by a storage provider entity for a plurality of tenants, and wherein the storage capacity data comprises storage capacity used by the at least one server when the data storage system is in an idle state;
    computing, via the at least one processing device, a fixed capacity cost for respective tenants of the plurality of tenants based on the collected storage capacity data for the at least one server;
    collecting, via the at least one processing device, data on performance of one or more workloads by the at least one server in connection with accessing data stored on the at least one server by the respective tenants of the plurality of tenants, wherein the one or more workloads comprise a read operation, a write operation, a backup operation and a data de-deduplication operation, and wherein the collecting of the data on the performance of the one or more workloads comprises:
        pulling from the at least one server over a designated period of time, the data on the performance of the one or more workloads, and data corresponding to at least: (i) a storage processor computing workload of the at least one server, (ii) a disk input-output workload of the at least one server, and (iii) a component-to-component data transfer workload of the at least one server; and
        mapping, via the at least one processing device, the one or more workloads to at least the storage processor computing workload, the disk input-output workload and the component-to-component data transfer workload of the at least one server;
    computing, via the at least one processing device, a dynamic data access cost for the respective tenants of the plurality of tenants based on the collected data on the performance of the one or more workloads;
    generating, via the at least one processing device, respective graphical user interfaces for the respective tenants of the plurality of tenants and for the storage provider entity, the respective graphical user interfaces comprising graphical representations of the fixed capacity cost and the dynamic data access cost for the respective tenants, the collected storage capacity data and the collected data on the performance of the one or more workloads; and
    correlating, via the at least one processing device, the fixed capacity cost and the dynamic data access cost for the respective tenants of the plurality of tenants with one or more contribution factors associated with the storage provider entity;
    wherein the one or more contribution factors comprise an energy cost factor for an energy cost associated with operating the data storage system; and
    wherein the at least one processing device is configured to collect at least a first portion of the energy cost from a metering device external to the at least one server, and at least a second portion of the energy cost through a power application programming interface through which power consumption of the at least one server is collected, the at least one server including the power application programming interface.

2. The method of claim 1, further comprising computing, via the at least one processing device, values allocated to the respective tenants of the plurality of tenants based on the correlating.

3. The method of claim 2, further comprising transmitting, via a communication network, the computed values to the respective tenants of the plurality of tenants.

4. The method of claim 1, further comprising correlating, via the at least one processing device, a service level agreement value factor with the one or more contribution factors associated with the storage provider entity, wherein the service level agreement value factor comprises a value associated with one or more performance guarantees agreed upon between the storage provider entity and the respective tenants of the plurality of tenants in respective service level agreements.

5. The method of claim 4, wherein the value includes a cost for provision of redundant storage on the at least one server.

6. The method of claim 1, wherein the one or more contribution factors further comprise an asset investment value comprising a value associated with obtaining at least one of hardware and software assets for the data storage system.

7. The method of claim 1, wherein the one or more contribution factors further comprise an information technology specialist value comprising a value associated with maintaining at least one of hardware and software assets for the data storage system.

8. The method of claim 1, wherein computing the dynamic data access cost comprises:
computing a first designated monetary amount per memory unit per read for the respective tenants of the plurality of tenants; and
computing a second designated monetary amount per memory unit per write for the respective tenants of the plurality of tenants.

9. The method of claim 1, wherein computing the fixed capacity cost comprises computing a designated monetary amount per time period per memory unit of the storage capacity used by the at least one server for the respective tenants of the plurality of tenants.

10. A computer program product comprising a non-transitory processor-readable storage medium having encoded therein executable code of one or more software programs, wherein the one or more software programs when executed by a processor of a processing device implement the steps of:
collecting storage capacity data from at least one agent component associated with at least one server in a data storage system, wherein the data storage system is operated by a storage provider entity for a plurality of tenants, and wherein the storage capacity data comprises storage capacity used by the at least one server when the data storage system is in an idle state;
computing a fixed capacity cost for respective tenants of the plurality of tenants based on the collected storage capacity data for the at least one server;
collecting data on performance of one or more workloads by the at least one server in connection with accessing data stored on the at least one server by the respective tenants of the plurality of tenants, wherein the one or more workloads comprise a read operations, a write operation, a backup operation and a data de-deduplication operation, and wherein the collecting of the data on the performance of the one or more workloads comprises:
pulling from the at least one server over a designated period of time, the data on the performance of the one or more workloads, and data corresponding to at least: (i) a storage processor computing workload of the at least one server, (ii) a disk input-output workload of the at least one server, and (iii) a component-to-component data transfer workload of the at least one server; and
mapping the one or more workloads to at least the storage processor computing workload, the disk input-output workload and the component-to-component data transfer workload of the at least one server; and
computing a dynamic data access cost for the respective tenants of the plurality of tenants based on the collected data on the performance of the one or more workloads;
generating respective graphical user interfaces for the respective tenants of the plurality of tenants and for the storage provider entity, the respective graphical user interfaces comprising graphical representations of the fixed capacity cost and the dynamic data access cost for the respective tenants, the collected storage capacity data and the collected data on the performance of the one or more workloads; and
correlating the fixed capacity cost and the dynamic data access cost for the respective tenants of the plurality of tenants with one or more contribution factors associated with the storage provider entity;
wherein the one or more contribution factors comprise an energy cost factor for an energy cost associated with operating the data storage system; and
wherein the one or more software programs implement the step of collecting at least a first portion of the energy cost from a metering device external to the at least one server, and at least a second portion of the energy cost through a power application programming interface through which power consumption of the at least one server is collected, the at least one server including the power application programming interface.

11. The computer program product of claim 10, wherein, in computing the dynamic data access cost, the one or more software programs implement the steps of:
computing a first designated monetary amount per memory unit per read for the respective tenants of the plurality of tenants; and
computing a second designated monetary amount per memory unit per write for the respective tenants of the plurality of tenants.

12. The computer program product of claim 10, wherein, in computing the fixed capacity cost, the one or more software programs implement the step of computing a designated monetary amount per time period per memory unit of the storage capacity used by the at least one server for the respective tenants of the plurality of tenants.

13. The computer program product of claim 10, wherein the one or more software programs further implement the step of correlating a service level agreement value factor with the one or more contribution factors associated with the storage provider entity, wherein the service level agreement value factor comprises a value associated with one or more performance guarantees agreed upon between the storage provider entity and the respective tenants of the plurality of tenants in respective service level agreements.

14. The computer program product of claim 10, wherein the one or more contribution factors further comprise an asset investment value comprising a value associated with obtaining at least one of hardware and software assets for the data storage system.

15. The computer program product of claim 10, wherein the one or more contribution factors further comprise an information technology specialist value comprising a value associated with maintaining at least one of hardware and software assets for the data storage system.

16. An apparatus comprising:
a memory; and
a processor operatively coupled to the memory and configured to:

collect storage capacity data from at least one agent component associated with at least one server in a data storage system, wherein the data storage system is operated by a storage provider entity for a plurality of tenants, and wherein the storage capacity data comprises storage capacity used by the at least one server when the data storage system is in an idle state;

compute a fixed capacity cost for respective tenants of the plurality of tenants based on the collected storage capacity data for the at least one server;

collect data on performance of one or more workloads by the at least one server in connection with accessing data stored on the at least one server by the respective tenants of the plurality of tenants, wherein the one or more workloads comprise a read operation, a write operation, a backup operation and a data de-deduplication operation, and wherein the collecting of the data on the performance of the one or more workloads comprises:

pulling from the at least one server over a designated period of time, the data on the performance of the one or more workloads, and data corresponding to at least: (i) a storage processor computing workload of the at least one server, (ii) a disk input-output workload of the at least one server, and (iii) a component-to-component data transfer workload of the at least one server; and mapping the one or more workloads to at least the storage processor computing workload, the disk input-output workload and the component-to-component data transfer workload of the at least one server; and compute a dynamic data access cost for the respective tenants of the plurality of tenants based on the collected data on the performance of the one or more workloads;

generate respective graphical user interfaces for the respective tenants of the plurality of tenants and for the storage provider entity, the respective graphical user interfaces comprising graphical representations of the fixed capacity cost and the dynamic data access cost for the respective tenants, the collected storage capacity data and the collected data on the performance of the one or more workloads; and correlate the fixed capacity cost and the dynamic data access cost for the respective tenants of the plurality of tenants with one or more contribution factors associated with the storage provider entity;

wherein the one or more contribution factors comprise an energy cost factor for an energy cost associated with operating the data storage system; and wherein the processor is further configured to collect at least a first portion of the energy cost from a metering device external to the at least one server, and at least a second portion of the energy cost through a power application programming interface through which power consumption of the at least one server is collected, the at least one server including the power application programming interface.

17. The apparatus of claim 16, wherein the processor is further configured to correlate a service level agreement value factor with the one or more contribution factors associated with the storage provider entity, wherein the service level agreement value factor comprises a value associated with one or more performance guarantees agreed upon between the storage provider entity and the respective tenants of the plurality of tenants in respective service level agreements.

18. The apparatus of claim 16, wherein, in computing the dynamic data access cost, the processor is configured to:

compute a first designated monetary amount per memory unit per read for the respective tenants of the plurality of tenants; and compute a second designated monetary amount per memory unit per write for the respective tenants of the plurality of tenants.

19. The apparatus of claim 16, wherein, in computing the fixed capacity cost, the processor is configured to compute a designated monetary amount per time period per memory unit of the storage capacity used by the at least one server for the respective tenants of the plurality of tenants.

20. The apparatus of claim 16, wherein the one or more contribution factors further comprise an asset investment value comprising a value associated with obtaining at least one of hardware and software assets for the data storage system.

* * * * *